350-396 SR
XR 3,650,625
[redacted]
TX 4046E WP
X 4048D

United States
Hoyte, Jr.

3,650,625
Mar. 21, 1972

[54] MULTIPLE AUTOMATIC TRANSFER OF MOLECULARLY ORIENTED MOTION PATTERNS

[72] Inventor: Paul A. Hoyte, Jr., Blue Ash, Ohio

[73] Assignee: Technical Animations, Inc., Port Washington, N.Y.

[22] Filed: Oct. 31, 1966

[21] Appl. No.: 590,789

[52] U.S. Cl. ..................................355/78, 117/3.1, 156/230, 156/240, 156/241, 161/402, 350/153, 350/154, 350/155, 352/87

[51] Int. Cl. ..........................................................G03b 27/02

[58] Field of Search ..................350/154, 164; 156/100, 240; 355/78

[56] References Cited

UNITED STATES PATENTS 2,524,286 10/1950 Dreyer ..............................156/100 X
2,544,659 3/1951 Dreyer ..............................350/154 X

*Primary Examiner*—Leland A. Sebastian
*Attorney*—Edward Halle

EXEMPLARY CLAIM

1. A method for orienting the surface molecules of a matrix into a motion pattern in the latent state comprising the steps of coating the surface of the matrix with photo resist material, preparing a mask for each vector of orientation desired, each of said masks having at least one portion adapted to permit exposure of all but the selected portions, then placing a first mask over the coating of photo resist exposing the photo resist to light, then washing away the unexposed portions and orienting all unexposed portions in a single vector, then stripping the photo resist from the matrix, then recoating the matrix with photo resist and placing another mask comprising other selected areas, then exposing the photo resist to light and washing away the unexposed portions and orienting the uncovered portions of the matrix in a vector different from the previous vector, and then repeating the foregoing steps for as many vectors as may be desired.

1 Claims, 21 Drawing Figures

3650625
OR IN 96/36

Patented March 21, 1972 3,650,625

3 Sheets-Sheet 1

Paul A. Hoyte, Jr. INVENTOR.

BY Edward Halle ATTY.

Paul A. Hoyte, Jr. INVENTOR.

BY Edward Halle
atty.

Paul A. Hoyte, Jr. INVENTOR

BY Edward Halle
ATTY.

MULTIPLE AUTOMATIC TRANSFER OF MOLECULARLY ORIENTED MOTION PATTERNS

This invention relates to the creation of optically apparent change or motion by the use of polarized light in varying orientations to create animated polarized images, and in particular, relates to apparatus, methods and products concerned with multiple reproduction of animated polarized images by transfer of motion patterns from a master matrix.

It is well known in the art to make animated polarized images by hand through forming a mosaic of variously oriented pieces of plain polarizer, or birefringent materials assembled with a polarizer. Examples may be found in U.S. Pat. No. 2,357,310 granted to Fford Burchell on Sept. 5, 1944 and in U.S. Pat. No. 2,882,631 granted to Philip Boone on Apr. 21, 1959. While these products, when viewed through a rotating linear polarizer, or analyzer, are eminently satisfactory, each one must be made separately by hand, requiring individual skilled workers and at great expense; or by some automated process that duplicates the hand technique, by placing selected, oriented material together in a single frame. Here again, the processes require considerable technique, time and expense.

It has always been a problem in this field to find a way of reproducing large numbers of identical animated polarized images from a single master. Efforts to solve this problem have resulted in photographic multilayer processes such as those described in U.S. Pat. No. 2,977,845 granted to Philip Boone on Apr. 4, 1961 in which a series of differently oriented frames are laminated together to form a composite having areas oriented in different vectors. This is a successful process. However, it requires the lamination of differently prepared multilayered materials which entails problems of registration and thickness of the end product. Other efforts have been made along other lines of development by the use of pressure and heat to make repetitive stress patterns in birefringent materials to form multiple numbers of animated images from a master pattern.

Irrespective of what method is used to produce an animated polarized image capable of presenting the phenomenon of motion to the viewer through the use of polarized light, the fact remains that the operation of any of these systems depends upon the use of materials in which the molecules can fall into parallelism and in alignment along desired lines of orientation.

It is now apparent that a molecularly oriented surface pattern in a plurality of vectors on a sheet of material may be transferred to another material which has been softened so that the molecules will become aligned through the oriented force of the molecules of the master material. The material to be aligned in accordance with the master may be softened by the use of either heat or a solvent, and such material should be maintained against the master by pressure such as force of gravity or other pressure. For example, a matrix may be made up on a metal sheet such as a sheet of aluminum in the usual manner having at least one portion molecularly oriented in a plurality of vectors. Then a sheet of a thermoplastic such as Videne may be heated to soften it while being pressed against the aluminum sheet matrix. The molecules in the plastic will align themselves to the molecules in the matrix, and when the plastic has been cooled, it may be removed and the process may be repeated time and again without disturbing the orientation of the molecules in the matrix so that continuous repetitive transfers of the molecular pattern may be made from the matrix to a material to be treated.

There are many ways to develop light polarized characteristics in the treated material. For example, the treated material may be covered with a coating of dichroic dye. The dichroic dye, while in a solvent, is in a liquid state. It is permitted to dry and go through the nematic state during which its molecules will become aligned to the molecules in the treated material. The treated material covered with a layer of dichroic dye may now be used in any light polarized system well known to the art to produce the phenomenon of motion to the viewer. The nematic dichroic dye material may be flowed onto the matrix in the first instance and a thermoplastic sheet may be pressed against the dichroic dye after it has set, and by either the application of heat or adhesive, the dye will adhere to the thermoplastic material which, when removed from the matrix, will have a coating of dye having the molecular orientation of the matrix.

Dichroic dyes suitable for use in the invention are described in U.S. Pat. No. 2,400,877 issued to John F. Dreyer on May 28, 1946; U.S. Pat. No. 2,524,286 issued to John F. Dreyer on Oct. 3, 1950; and U.S. Pat. No. 2,544,659 issued to John F. Dreyer on March 13, 1951. The dichroic dyes suitable for this invention are those described in the said patents which have the property of achieving molecular orientation while still in the nematic state or while in the fluid state as the dye hardens.

The plastics used in the invention should be of a type having polar linear molecules and high tensile strength and a relatively high melting point. Some plastic materials which have been found particularly advantageous are Videne (sold by Goodyear Tire & Rubber Co.), Mylar (sold by E. I. Dupont de Nemours), Terafilm (sold by Terafilm Corp. of Stamford, Connecticut), and other commercially available terephthalate polyester films. It has been found that the para terephthalates are better for present purposes than those in which the two active groups are not in the para arrangement. Also, it is better to use films free from molecular orientation produced in manufacture of the film. For additional detail on these materials see "Polymers and Resins" by Brage Golding (Van Nostrand), Page 285; U.S. Pat. No. 2,965,613; Soc. Photograph, Eng. Jour. (1961) Vol. 17, No. 10, pp 1–5.

It is the object of this invention to provide apparatus, processes and products in which a master can be molecularly oriented in a plurality of vectors and then be used as a matrix to transfer the molecular orientations so oriented directly to a film made of nematic dichroic material thus forming a product polarized in a plurality of vectors; or to a sheet or web of optically inert carrier material which in turn can be coated with dichroic dye so that the film of dichroic dye will then achieve the same orientation as appeared on the basic matrix.

It is a further part of the invention to transfer the film of dichroic dye, molecularly oriented in a plurality of vectors, from the matrix, or from the optically inert carrier material to a further carrier material which may or may not be a polar substance.

In the methods presently known to the prior art, the molecular orientation needed to produce animated polarized images is made on those portions of the product where the apparent motion is desired. In other words, the orientation areas do not usually take up the entire area of the product, but may take up one or more selected areas where a motion pattern, or animation phenomenon is desired. For example, a picture of an automobile in which the wheels should have the effect of motion would have oriented molecules registered at the area of the wheels in a plurality of vectors to give the effect of apparent motion when viewed through polarized equipment. It is, therefore, desirable in a process as contemplated by this invention to provide for transfer of only those portions of the molecularly oriented dichroic dye as will register over the portions of the ultimate visual stimuli or picture where motion is desired.

Since the dichroic dye used in the invention will flow over the entire matrix or molecularly oriented surface from which a transfer will be made, the only control of specific areas would be through the ability to transfer portions of the dye from the matrix or surface to the desired product.

It is, therefore, another object of this invention to provide for the selective transfer of portions of oriented dichroic dye from a matrix to a carrier material or to an end product, and it is also an object of this invention to provide materials adapted to the selective transfer of the dye as well as matrices having differing degrees of adhesion to the dye to aid in the selective transfer process.

Another object of the invention is to produce various products utilizing polarized light by the means and methods of the invention.

Thus, the invention contemplates a process and apparatus by which a film of nematic dichroic material may be molecularly oriented in a plurality of vectors to provide a plurality of desired images corresponding to a master matrix, and repetitively transfer such images to a finished product. Such finished animated polarized images may be activated by any known viewing or projecting apparatus or process known to the art.

Thus, when the objects of the invention are achieved, multiple copies of a molecularly oriented pattern can easily be made automatically from a master matrix by repetitive transfer from the matrix to the end product in accordance with the invention.

The accompanying drawings are provided to aid in an understanding of the methods, apparatus and products of the invention. Similar numerals refer to similar parts throughout the several views.

Figure 1:
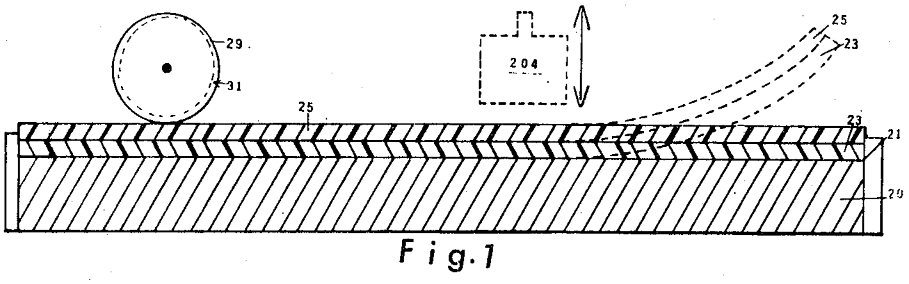
FIG. 1 is a sectional view of a matrix in accordance with the invention showing the matrix in use and with parts dotted in to show alternative components and different positions.

The terms "motion dye," "motion pattern," "automatic transfer of motion pattern", "selective transfer" of motion dye or motion pattern, "differential matrix" and "light pervious" will be used in the specification.

"Motion dye" is a motion material such as a film of nematic dichroic dye or the like which has been formed over a molecularly oriented surface and permitted to set and achieve the molecular orientation of the surface over which it is formed. The resulting film of dye may be transferred to a transparency or to a reflective surface which may also have visual stimuli so that when the transparency or reflective surface is viewed in conjunction with a rotating linear polarized analyzer, commonly known as a "spinner" or "motion adapter," or by means of rotating polarized rays of light on a reflecting surface, or any other way known to the art, the phenomenon of motion will be present to the viewer at those portions where the molecularly oriented dye is placed. This motion may be viewed on the end product alone or in conjunction with other visual stimuli on the end product. Thus, we define the film of dye to which a motion pattern has been transferred as "motion dye."

A "motion pattern" is an image formed by oriented surface molecules of a master matrix (in the latent state), or by correspondingly arranged molecules transferred to another material from said matrix by means of the invention, it being understood that the latent image forming the motion pattern has no motion but achieves the phenomenon of motion when placed in a substance such as a motion dye and viewed through the proper equipment as aforesaid.

"Automatic transfer of motion pattern" means molecular orientation of a material such as a nematic dichroic material to the molecular orientation of a master matrix and transfer of such dye to another carrier surface, for example, a color transparency containing a color picture wherein the motion dye contains a motion pattern for an animated polarized image to be viewed in conjunction with all or a portion of the visual stimuli of the color transparency. Automatic transfer may also be made to a solid carrier having reflective means. The visual stimuli, or picture, may be in color, it may be in black and white, it may be photographically placed on the carrier material, or it may be printed, drawn or painted, or placed on the carrier material by any process known to the art. The carrier material may be transparent, translucent or solid as aforesaid so that it may be used in a projecting, reflecting or transmitted light technique, and the material may be made of paper, plastic, metal, wood or any material capable of carrying visual stimuli and a motion dye surface. The automatic transfer is achieved by repeatedly applying motion dye to a master matrix and permitting the dye to set with the desired motion pattern, and then transferring the motion dye to a carrier material so that at least one animated polarized image combined with picture material can be made. Each of said succeeding automatic transfer products will be identical to each of the others as a result of the repetitive multiple automatic transfer of said molecularly oriented motion dye.

"Selective transfer" means the transfer of only those portions of the motion dye from the matrix which contain a motion pattern. For example, a carrier material containing visual stimuli such as a picture may have a picture of an automobile on it wherein it is desired to impart rotary motion to the wheels of the automobile. The matrix is prepared with two latent motion pattern areas representing the wheels. The carrier material containing the picture of the automobile is pressed, with a space for the wheels, in exact register to the latent motion pattern for the wheels. Transfer of the motion dye from the matrix containing the motion pattern of the wheels is made by selectively transferring only those portions of the dye with the motion pattern from the matrix to the wheel portions of the carrier material. Thus, "selective transfer" means transferring only selected portions of dye from a matrix to selected portions of a carrier material.

A "differential matrix" is a matrix having at least one area containing a motion pattern and which is adapted for use as a matrix to impart the motion pattern to a motion dye which in turn is to be transferred by means of "selective transfer" from the matrix to a carrier, the term "differential" as applied to such a matrix meaning that the portion of the matrix containing the latent motion pattern will have a different differential of adhesiveness to the motion dye than the balance of the matrix so that when the motion dye is transferred in accordance with the invention, selective portions of the motion dye only will be transferred from those portions of the matrix in which the degree of adhesiveness to the dye is lower than in the other portions so that the dye in the higher degree of adhesive portions will remain on the matrix and not be transferred.

"Light pervious" as used herein is meant to define a sheet, web or film of material which may or may not have visual stimuli thereon, and which may be projected by a through-the-film projection process onto a screen, or viewed by rear illumination or transillumination. Thus, the term "light pervious" includes any material, as distinguished from "opaque" material, whether such material be transparent, translucent or may be defined by any other term. It is understood that the term "opaque" means any material, regardless of definition, through which visual stimuli may not be projected onto a screen or through which visual stimuli may not be viewed by rear illumination or trans-illumination.

The simplest way in which the invention can be practised is on a substantially flat matrix such as matrix 20. The surface 21 of the matrix 20 can be oriented by a suitable orienting process known to the art, for example by rubbing or polishing the surface 21 with felt immersed in mild pumice. The surface 21 is rubbed to provide the molecular orientation in the desired vectors. A layer of motion dye 23, such as a dichroic dye as described in the Dreyer patents hereinabove, is poured over the surface 21 and permitted to dry and set going through the nematic state and obtaining a transfer of the motion pattern from the matrix 20. A sheet of thermoplastic material 25 is then placed over the motion dye 23, in the presence of heat (from heater means indicated at reference numeral 27) and pressure (from, for example, a hand roller such as roller 29). The set motion dye 23, in the form of a thin film, will transfer and adhere to the thermoplastic material 25, and dye 23 will lift off with sheet 25 as shown in the dotted lines in FIG. 1 of the drawings.

There are many other ways in which the flat matrix can be used as an apparatus, and it is to be understood that all of the methods described in connection with the cylindrical matrix 60 as set forth hereinbelow may usually be employed with the flat matrix 20 to produce sheets containing animated polarized images.

There are many ways known to the art to orient a matrix; however, I have devised a unique method particularly adaptable to the automated operation of this invention. I can prepare a matrix, either flat 20 or cylindrical 60 by coating the matrix with photo resist, exposing the resist at selected areas, washing out the unexposed areas, then orienting said unexposed areas in a single vector, then washing off the photo resist and recoating and washing out other selected areas for orientation in another single vector, and continuing the operation in as many vectors as are necessary in the selected areas to produce a complete motion pattern or motion patterns as latent images in the matrix.

This preferred method for achieving orientation of the matrix comprises the following steps. First, a matrix 20 is selected. Then a number of masks, such as photographic negatives 30, 36, 42 and 48 are made adapted to cover the matrix. Each mask negative comprises an opaque area at those portions where the photo resist is not to be exposed, corresponding to those areas on the matrix that are to be oriented in a single vector with reference to the particular negative.

Figure 2:
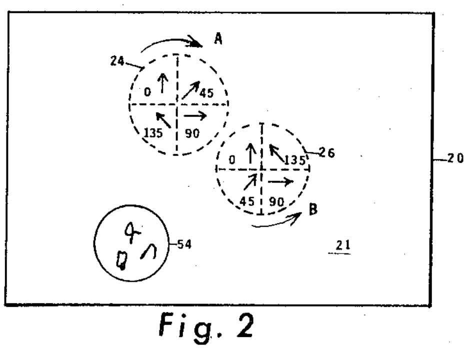
FIG. 2 is a top plan view of the surface of the matrix in FIG. 1 reduced in size.
Figure 6:
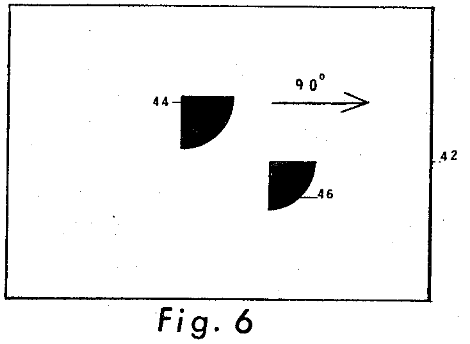
FIG. 6 is a top plan view of another mask for use with the matrix of FIG. 2.

Then a coating of photo resist 22 is placed on the matrix 20. Reference to FIG. 2 of the drawings will show representations of a latent motion pattern on the matrix 20. This comprises two circular representations 24 and 26. It is intended that these circular representations move in opposite directions as suggested by the arrows A and B. In accordance therewith, the quadrants of sections 24 and 26 are marked with arrows and the degree direction of each arrow for each quadrant.

For example, representation 24 starts in the upper left hand quadrant with a vector of 0°, and then runs clockwise to 45°, then to 90°, and then to 135°. In representation 26, the upper left hand quadrant starts with 0°, and then runs counterclockwise to 45°, 90° and then 135°. It is to be understood, of course, that when the latent motion pattern 24 and 26, as described herein, is transferred by any of the means set forth herein, motion will be achieved through the use of the motion adapters or by any other means in conjunction with polarized light.

Figure 3:
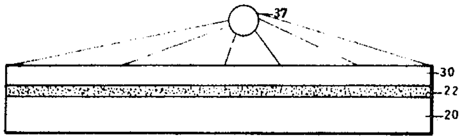
FIG. 3 is a side elevation of the matrix of FIG. 2.
Figure 7:
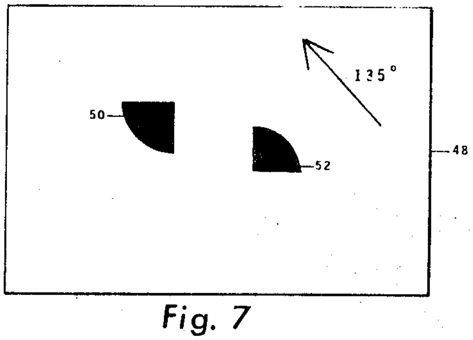
FIG. 7 is a top plan view of another mask for use with the matrix of FIG. 2.
Figure 4:
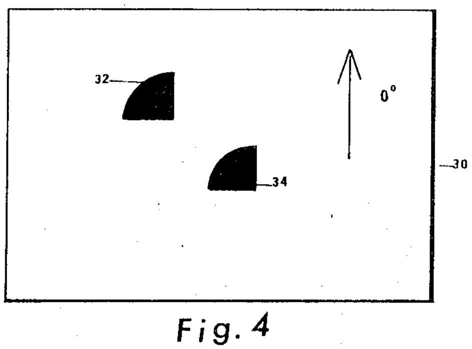
FIG. 4 is a top plan view of a mask for use with the matrix of FIG. 2.

The next step is to prepare as many mask means, or negatives, as there are vectors of aligned orientations. In the example, there are four vectors, 0°, 45°, 90°, and 135°, so there will be four masks, such as negatives 30, 26, 42 and 48. Negative 30 corresponds to the zero quadrants of areas 24 and 26 on matrix 20. Negative 30, as well as all of the other negatives, may be made by any photographic process known to the art which will provide a clear film with opaque portions 32 and 34. The matrix 20 is then covered with photo resist 22 and negative 30 is then placed over it as shown in FIG. 3 of the drawings. The masked matrix 20 is then exposed to ultraviolet light 31. The negative 30 is then removed and the photo resist 22 is developed. The exposed portions will then harden and the opaque portions 32 and 34 which masked the matrix 20 will not be exposed and may be washed away leaving the hardened portions covered and leaving quadrants of 24 and 26, marked 0°, open to view without a photo resist cover.

The entire matrix 20 can then be rubbed longitudinally in the direction of the 0° arrow. This will provide molecular orientation at the surface of the open portions, leaving the covered portions' molecules undisturbed.

The hardened photo resist is then removed from the entire surface of the matrix 20 with a stripper such as paint remover. Then a second coating of photo resist is applied to the surface of the entire matrix 20. Then a second negative 36 having a clear body with opaque portions 38 and 40, corresponding respectively to the 45° quadrants as shown in FIG. 2 is placed over the matrix with portions 30 and 40 exactly in register over the desired 45° quadrants. The same process is repeated, only this time the rubbing or other molecular orientation processing is done in a 45° vector aligning the molecules in the 45° vectors and leaving the rest of the surface of the matrix undisturbed.

The entire process is repeated again, only this time using negative 42 which has opaque areas 44 and 46 corresponding to the 90° areas on matrix 20, and finally, for the example given herein, the process is repeated again with negative 48 having opaque areas 50 and 52 provided to orient the 135° areas on representations 24 and 26 of matrix 20.

I may use the foregoing method to orient a flat matrix or a cylindrical matrix, or I may make a cylindrical matrix by first orienting a flat sheet and then curling it into a cylinder and installing it on a roller or other part of apparatus adapted to fit into the frame of the apparatus invention.

I may also use this method as a method of making multiple matrices by using the same negatives 30, 36, 42 and 48 and repeating the process for any number of matrices desired. I have described this method with four vectors, 0, 45, 90 and 135, and in each vector I have provided two separate selected areas 24 and 26 on the matrix 20. It is to be understood that any number of vectors having any number of selected areas may be provided, and a separate negative having any number of opaque areas is provided for each vector desired.

I may also combine the foregoing method for orienting a portion of a matrix and then placing further latent image material on the matrix by means of hand orientation in a variety of patterns, as illustrated at portion 54 of matrix 20 in FIG. 2 . Reference number 54 is representative of a motion pattern of an irregular shape which may be provided to indicate the licking of flames of a fire. Thus, the upper portion of the matrix 20 has the regular representations 24 and 26 oriented by means of photo resist method, and the lower portion 54 is oriented by hand by an artist.

Negatives with opaque portions made photographically are illustrated as a preferred form, and any method coming within the claims may be used.

Figure 8:
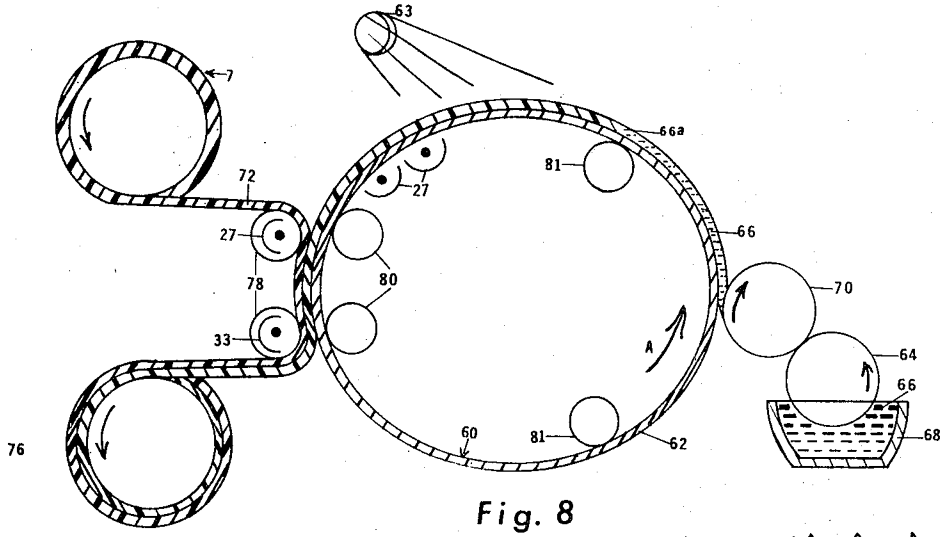
FIG. 8 is a side elevation, partly in diagram and partly in section, of an apparatus of the invention.

A cylindrical matrix 60 may be used in the apparatus of the invention. A cylindrical matrix may be oriented in its cylindrical form, or a flat matrix 20, with oriented motion pattern, may be curled into a cylinder 60, which may be used as a roller to transfer the motion pattern to a carrier material or to a motion dye and then to a carrier material. The surface of the roller 60 can be any one of many that have been found to be polarisable such as glass, plastic, mineral, metal or any other polarisable material. The cylinder 60 of the master matrix is adapted to rotate in a direction such as arrow A as shown in FIG. 8. The surface 62 of the master may be molecularly oriented with a motion pattern by a suitable orienting process, preferably as described hereinabove.

Alongside the master roller 60, I provide a pair of dye applicator rollers. Roller 64 is a fountain roller and is immersed in the motion dye material 66 which is in a reservoir 68. The fountain roller 64 picks up the dye 66 and transfers it to a doctor roller 70 which in turn disperses the dye 66 along the entire length of the master 60 in a layer 66*a* which is air dried and hardened as the roller 60 revolves in the direction of arrow A. A blower 63 may be provided to assist the air drying.

Figure 9:
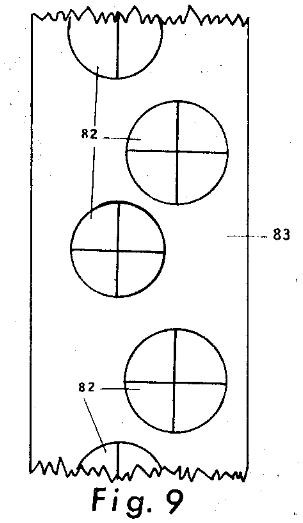
FIG. 9 is a plan view of a web of material with parts broken away.

As the layer of motion dye 66a dries and hardens on the surface 62 of roller 60, it will achieve the identical molecular orientation (motion pattern) as the surface 62 of roller 60. The layer of dye 66a proceeds in the direction of arrow A toward a continuous sheet, film or web of thermoplastic carrier material 72 which is stored on a supply reel 74 and taken up on a takeup reel 76. The carrier material 72 is passed between pressure roller 78 and the surface 62, it is heated by heater means 27 to about 275°–300° F, and drive pressure roller 80 may be placed underneath surface 62 to provide additional pressure at the point where the carrier material 72 is pressed against the hardened dye 66*a* in faced contacting relationship. Idler roller 81 may also be used to support the matrix 60 in the frame of the device. The carrier material 72 will then pick up the film 66*a*, which will adhere to the surface of material 72. The hardened dye 66a may also be transferred without heat to a carrier material such as a sheet 83 as shown in FIG. 9 of the drawings which has adhesive portions 82 on its surface which are prepared in the shape of and are arranged to register with particular portions of the film 66*a*. Thus, when the carrier material 82 is pressed against the film 66*a*, the adhesively coated areas 82 will pick up the portions of motion dye 66*a* with motion pattern which will then be adhered to and carried on the surface of the carrier material 83 at the desired portions.

In FIG. 9 of the drawings, the adhesive portions 82 are in the form of representations similar to representations 24 and 26 in FIG. 2. Thus, adhesive portions 82 will pick up the corresponding motion patterns from the film 26*a* which, when viewed thereafter through a proper polarizer or analyzer, will show the representations in animated relationship.

Figure 10:
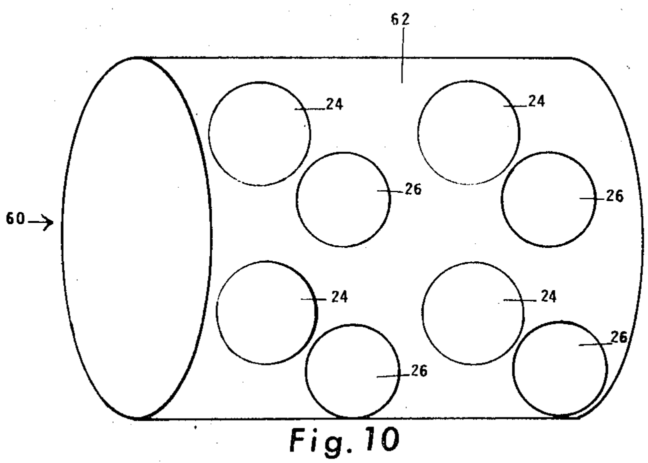
FIG. 10 is a perspective view of a matrix.

As shown in FIG. 10 of the drawings, surface 62 of matrix 60 may be repetitively prepared with representations 24 and 26, either side by side or in succession, or a combination of side by side and successive representations, to that it will have latent motion patterns for a repetitive successive series of identical images. For example, the representations 24 and 26 adapted to be picked up by adhesive portions 82 may be placed around surface 62 a plurality of times so that one revolution of matrix 60 may place a number of motion patterns on the carrier web 81 which may then be cut or slit laterally or longitudinally into separate identical oriented images within individual frames.

It is to be understood that flat matrix 20, when curled into a cylinder, is the equivalent of matrix 60.

I may also provide an intermediate carrier strip 100 between the matrix 60 and the final carrier material 72. The purpose of providing this intermediate carrier strip 100 is to provide a longer carrier area than would be available on the matrix 60 for the motion dye 66 to go through the nematic state, become oriented, and dry. This is important because it permits the use of a smaller matrix 60 which may be less expensive to prepare. For example, let us say that a distance of 100 linear inches was needed for the drying of the motion dye 66. This would require a matrix approximately 33 inches in diameter, and would require a matrix having an excessive number of individual repetitions of representations 24 and 26 on the 100 inch surface.

I would, therefore, provide a matrix such as matrix 61, with a much smaller diameter, having a surface 63 having the required number of motion pattern representations. This matrix 61 would then be used to orient the carrier material 100 in any number of motion patterns up to the required length. Then the motion dye 66 would be applied (see FIG. 11) to the surface of carrier material 100 by a roller 70, and after hardening to a film 66*a*, with the motion pattern set, transferred to a carrier material 72 by heat (heater 27) and pressure (rollers 80).

The belt carrier 100 is also provided to aid in selective transfer by the continuous hot nip or hot stamp process as will be described hereinbelow.

In order to transfer the molecular orientation of the matrix surface 63 to the intermediate thermoplastic arrier material 100, it is necessary to provide heat to soften and pressure to maintain the carrier material 100 in contact with the surface 63 of the matrix 61 for a period, and then for a cooling period so that the molecular orientation (motion pattern) of the matrix 61 will be fixed in the carrier 100. The contact between the intermediate carrier material 100 and the matrix surface 63 between the heating (see heating means 27 in FIG. 11) and during the cooling (cooling means 33) is between pressure rollers 110 and 112 in FIG. 11 of the drawings. The intermediate carrier material 100 is preferably made of a thermoplastic film or a substrate material such as paper coated with a thermoplastic film.

I also provide cooling means in the apparatus as illustrated in FIG. 8 of the drawings at reference numeral 33 within the roller 78. The presence of cooling means in any of the apparatus of the invention may be necessary where the time interval of contact of the motion material dye 66*a* in the presence of heat with the thermoplastic web (either a web such as web 72 or a web such as web 100) is insufficient after the heating step to permit cooling and complete setting of the motion pattern in the dye 66*a* without auxiliary cooling means. For example, reference to FIG. 8 of the drawings will show that there is a distance between heating means 27 and cooling means 33. If the roller were large enough, the dye 66*a* would cool and set between these two points, or if the speed of the roller were slow enough, there would be sufficient time for cooling. However, in a small roller, or in a roller in a high speed process, the auxiliary cooling means 33 might well be necessary.

The intermediate carrier material 100, with a coating of motion dye 66*a*, can be used as an end product itself since the images on such a thermoplastic film with a dichroic dye coating can be analyzed through a rotating polarizer to produce animated polarized images.

Figure 12:
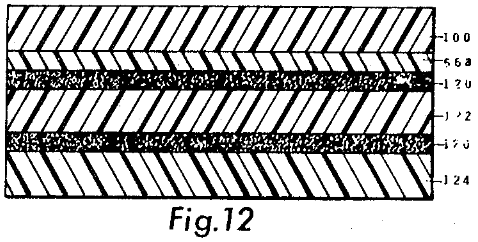
FIG. 12 is a sectional view of a product of the invention.
Figure 5:
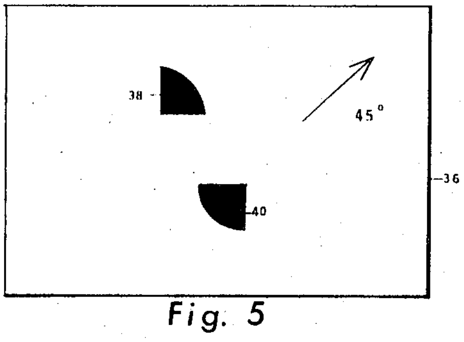
FIG. 5 is a top plan view of another mask for use with the matrix of FIG. 2.

One way of doing this would be to laminate the dye side 66*a* of film 100 to a double adhesive 120 faced light pervious film 122 and then press such laminate on its other adhesive side 120 to a display print or transparency 124 (see FIG. 12) to provide a polarized animation effect when viewed either by reflected light or transmitted light.

An outdoor display product, or other type product, may be made (see FIGS. 13 and 14 of the drawings) by transferring the dye 66*a* from the thermoplastic film of intermediate carrier 100 by heat and pressure to another thermoplastic film 130 and laminating a layer of thermoplastic film 132 by heat and pressure to the dye side. The heaters are not shown in FIG. 13; however, reference to FIGS. 8 and 11 will show how the heater means 27 should be disposed.

Carrier 100 is a film with a motion dye 66*a* adhering to it by cohesion. When this dye coating 66*a* is transferred to thermoplastic web 130 by means of heat and pressure, it becomes adhered to the second thermoplastic sheet. The film 130 to which the coating is adhered should have a lower softening point than the original transfer film 100 so that the dye 66*a* will adhere to it. Thus, the dye 66*a* is stripped off the original film 100 and transferred to the second film 130 with the lower softening point. Then a third film 132 of the same softening point as the second transferee film 130 is adhered over the dye 66*a* so that the dye 66*a* is sandwiched between the said second 130 and third 132 layers. This sandwich 134 is now weatherproof and will stand up very well in out-of-door displays involving transmitted light or reflected light.

I have found that a metal matrix curled into a cylinder made of a metal, for example aluminum, having an 8 ½ inch diameter and a metal thickness of 0.016 inch is suitable. The diameter of the matrix can, of course, be varied and the range of thickness of the metal, when aluminum is used, is operable between 0.10 to 0.25 inches and good results may be obtained outside of this range.

In the operation of the invention as described and set forth in connection with FIG. 11 of the drawings, I find that a carrier material 100 made either of Lexan, a polycarbonate plastic (see U.S. Pat. No. 3,027,352) or KODACEL triacetate sold by the Eastman Kodak Company are suitable for thermoplastic webs or films with a relatively higher softening point. For the material of webs 130 and 132, a plastic having a lower softening point than the above mentioned thermoplastic materials should be used, and I have found that Videne sold by Goodyear Tire & Rubber Company is suitable.

I have found in working the processes of this invention that the practical range of softening for Lexan is between the range of 350°–385° F. I have also found that the practical range of softening for triacetate is between 280°–300° F, and that the practical range of softening of Videne is between 185–210° F. Therefore, when I use a preferred material such as triacetate to transfer motion dye from a matrix to the said triacetate as a carrier material, this should be with the triacetate heated to 285° F. This temperature would be suitable at a speed of running the triacetate web of 2 feet per minute. If the web is run at a higher rate of speed, the temperature would have to be increased because the web would be at the point of transfer a shorter period of time.

Where Videne is used as the carrier material to transfer dye from a metal matrix and the web is run at 2 feet per minute, the softening temperature at the point of transfer should be 185°–200° F. When it is desired to transfer the dye from a relatively high softening point film such as triacetate to a lower softening point film such as Videne, the temperature at point of transfer where the webs are travelling at the rate of 2 feet per minute should be 185°–200° F. In this way, the Videne will soften and the triacetate will not reach a softened condition. In this manner, the molecular orientation is maintained in the triacetate during the transfer of the dye from the triacetate to the Videne, maintaining the motion pattern in the film.

I have also found that a pressure of approximately 100 pounds per square inch for approximately 6 seconds is satisfactory.

In addition, it has been found that the motion dye 66*a* will adhere to a softened thermoplastic, and in this manner can be stripped from the thermoplastic which is not softened since there will be a much greater degree of adhesiveness to a softened thermoplastic than to the other materials.

I have mentioned selective printing by means of selective transfer hereinabove with reference to adhesive portions 82 on web such as web 83 illustrated in FIG. 9 of the drawings. Selective transfer may also be accomplished by providing a matrix in the form of a differential matrix in which selected portions of the motion dye 66*a* may be transferred from such a matrix by providing the surface of the differential matrix with different degrees of adhesion with respect to the motion dye 66*a*.

Figures 15, 16:
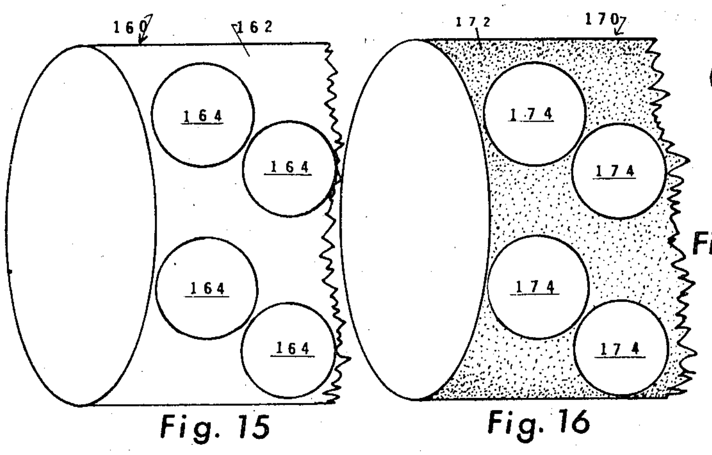
FIG. 15 is a perspective view of a matrix with parts broken away.
FIG. 16 is a perspective view of a matrix with parts broken away.

There is a certain degree of adhesiveness between the hardened dichroic motion dye 66*a* and a matrix 60 made of a metal, for example of aluminum. If a portion of the matrix were treated or constructed in a manner which would provide a greater degree of adhesion to the dye 66*a*, and another portion of the matrix were treated or constructed in a manner which would provide a lesser degree of adhesion to the dye film 66*a*, then removal of the dye 66*a* from the matrix in selected areas would be materially assisted because the matrix would be prepared with areas having a lower degree of adhesion where it would be desired to transfer selectively portions of the dye 66*a*. These portions of the matrix would have a lower degree of adhesion to the dye 66*a* than the balance of the matrix. I have found, for example, that anodized aluminum has a much greater degree of adhesion to the dye 66*a* than non-anodized aluminum. I have also found that nickel has a lower degree of adhesion to the dye 66*a* than aluminum, and a much lower degree of adhesion to the dye 66*a* than anodized aluminum. I, therefore, prepare a matrix 160 (FIG. 15) of aluminum and anodize all of the surface portions 162 with the exception of those portions on which it is desired to place the motion pattern representations. Those portions on which the motion pattern representations are to be placed are nickel plated as indicated at reference numeral 164 in FIG. 15. I will then orient the nickel plated selected areas 614 with a motion pattern in any of the manners known to the art or set forth herein. The dichroic dye 66*a* is then applied in any manner set forth herein, and the selected desired portions of dye 66*a* which will lie over nickel plated portions 164 may be transferred by selective transfer from the differential matrix 160, so prepared, and further processed in any manner set forth herein. For example, when a sheet of heated triacetate is placed against matrix 160 in proper pressure contact, the degree of adhesion between the motion dye 66*a* and the anodized aluminum portion 162 will be greater than the degree of adhesion between the dye 66*a* and the nickel plated portion 164. The triacetate sheet will lift the portions of dye over the nickel plated portions leaving the balance of dye 66*a* on the matrix.

While I have described this form of the invention with the specific example of an anodized aluminum matrix with nickel plated surface portions, the method and apparatus will work equally as well with other metals or materials having different degrees of adhesion with reference to the dye material.

I may also prepare a differential matrix 170 by coating those parts of the matrix to which it is desired that the dye 66*a* adhere with a photo resist material 172 to which the nematic dichroic dye 66*a* will bond as it is applied. The type of resist to be used is one whose molecules are cross linked by selective exposure to light which hardens that portion of the resist 172 which has been exposed and permits the unexposed portion 174 to be washed away or developed away. This leaves the developed portion of the photo resist 172 over the matrix and the undeveloped portions 174 bare. The bare portions 174 of the matrix are then oriented and the dichroic dye 66*a* over these portions will be easily transferred while the dichroic dye 66*a* over the coated portions 172 will be bonded to the coated portions 172.

This type of operation may also be done with other types of resins other than photo resist types. For example, a resin may be sprayed on by means of stencils or masks, or it may be silk screened onto the matrix, or it may be gravure printed onto the matrix with the result that the dichroic dye 66*a* will be bonded over that portion of the matrix where the resin is coated, and will be easily transferred from that portion of the matrix which does not have the resin coating.

Figures 20, 21:
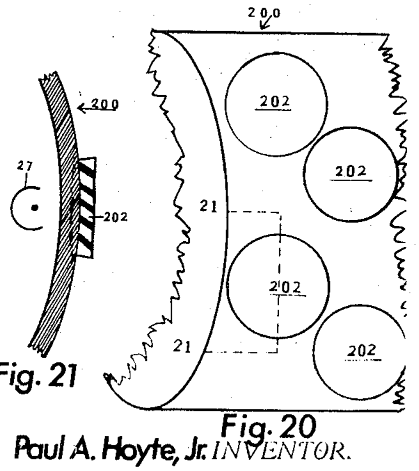
FIG. 20 is a perspective with parts cut away.
FIG. 21 is a section along the lines 21—21 in FIG. 20.

Transfer of dye by selective transfer may also be assisted by providing a hot stamp or hot nip step to the method and to the construction of the apparatus. Reference is now made to FIG. 11 of the drawings. A continuous hot nip roller is placed in the position of the dotted lines at reference numeral 200. Continuous hot nip roller 200 which is illustrated in FIGS. 11, 20 and 21 of the drawings has a series of raised portions 202 which correspond to the representation of the motion pattern on the master matrix. The roller 200 is preferably made of steel and is preferably heated internally by heater 27 and is pressed against the web 72 which in turn is pressed against dye 66*a* and against carrier material 100 as shown in FIG. 11. The continuous hot nip from raised portions 202 will assist that portion of the motion dye 66*a* underneath the heat and pressure of portions 202 to adhere to web 72, leaving the balance of the dye 66*a* on web 100. By this method and apparatus, I achieve selective transfer of the motion pattern from one material to another.

I make raised portions 202 out of silicone rubber which are adhered to the surface of steel roller 200 by a suitable silicone rubber adhesive. The surface of portions 202 will, of course, correspond in register to the latent motion pattern such as patterns 24 and 26 on the matrix.

The web 72 may be a web of Videne, or I may provide a web of paper with a resin coating or a web of foil with a resin coating, or any other type of web for the continuous hot nip operation coming within the scope of the invention.

The same type of operation may be done by means of an intermittent hot dye stamp or a hot dye stamp 204 such as illustrated in dotted line in FIG. 1 of the drawings. Hot dye stamp 204 has a stamping surface corresponding to the motion pattern of the dye 23 in FIG. 1. After the hot stamp is made in the direction of the double headed arrow in FIG. 1, when the carrier material 25 is removed it will have adhered to it only that portion of dye 23 which was underneath the hot stamp leaving the balance of dye on the matrix.

It may often be desirable after preparing a matrix for use in the practice of the invention to prepare one or more duplicate matrices so that two or more apparatus can work at the same time to produce identical animated polarized images. A duplicate metal matrix can be prepared in the following manner from a master. A flat master matrix 220 (FIG. 17) is prepared with the material to be animated oriented on the surface 222 of the matrix 220 as a latent motion pattern. The surface of the matrix is then oxidized as indicated at reference numeral 224 of FIG. 17. Then a layer of silver 226, or any other electro-conducting metal or material is chemically deposited on the surface 222 as oxidized 224 in any manner well known to the art. The molecules in the deposition of electro-conducting metal or material 226 will assume the orientation of the motion pattern of the surface molecules of the matrix 220. A support backing of copper, or other suitable material 238 is then deposited over the electro-conducting metal or material by electro-deposition so that there is now a sheet of copper 0.015 to 0.020 inches thick. The backing material and the electro-conducting material may now be separated from the master matrix. The layer of oxidation 224 permits the separation. The separated materials 226 and 228 may then be rolled into cylindrical form if desired as shown in FIG. 18 for use as a duplicate matrix in any of the processes and apparatus as described hereinabove. If desired, the separated material 226 and 228 may be kept as a flat sheet for printing sheets in the letter press manner as illustrated in FIG. 1 of the drawings.

A duplicate matrix may also be prepared from a master matrix by making a carrier film such as carrier film 100 and coating it with motion dye **66*a* as set forth hereinabove, then a second matrix form is prepared by coating the metal of the second matrix with photo sensitive lacquer which is then air dried and baked to bake out the solvents. The lacquer on the second matrix is now in a thermoplastic state. The motion dye is then transferred from film carrier 100 by heat and pressure to the thermoplastic coating on the second matrix by any of the methods set forth hereinabove. This transfers the dye 66*a* to the thermoplastic surface of the second matrix. The dye 66*a*** is thermoset into the matrix coating by cross linking the resin with ultraviolet light. Then the second matrix which now has an unoriented metal surface coated with an oriented plastic coating containing a motion pattern can be used in any form of the invention by coating the oriented coating surface with dichroic dye and then transferring the dichroic dye as set forth hereinabove. The coating produced by the duplicate matrix form of the invention is thermoset and is not affected by the amount of heat and pressure used when being used as a matrix.

Another method of making a duplicate matrix is similar with the exception that the second or duplicate matrix is coated with a resin which is cross linked and thermo-set when subjected to high heat of at least 400° or 500°. In this case, the coating is not baked but is air dried only to remove solvents, and is then thermo-set by super heated hot air, after the orientation is transferred from the dye.

I may also make a reflective orientation pattern with polarized color. I first prepare a film carrier 100 with motion dye **66*a* as set forth hereinabove. Then I transfer the dye 66*a* to thermoplastic resin coated on aluminum foil laminated to paper with heat and pressure. The dye 66*a*** is then coated with thermoplastic resin. I then laminate biaxially oriented mylar, or cellophane sheet, to the resin with heat and pressure. When viewed through a rotatable polarizing screen, the biaxially oriented material will provide pleasing color combinations to the animated oriented patterns in relation to the selected vectors of polarization of the pattern.

Figures 11, 13, 14, 17, 18, 19:
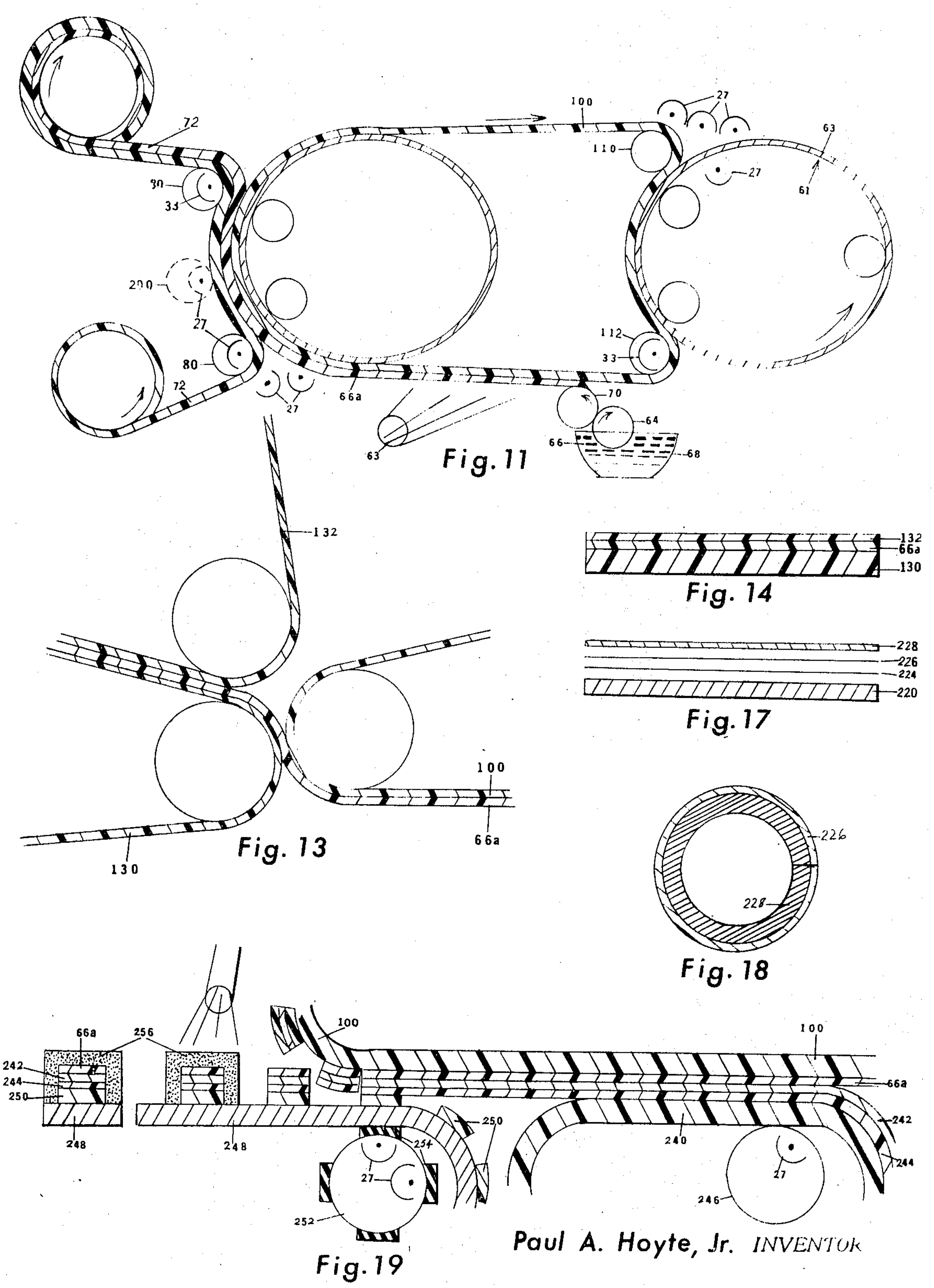
FIG. 11 is a view similar to FIG. 8 showing another apparatus of the invention.
FIG. 13 is a view similar to FIG. 11 with parts cut away showing a different arrangement of the apparatus of FIG. 11.
FIG. 14 is a sectional view of another product of the invention.
FIG. 17 is an exploded elevational view.
FIG. 18 is an end elevation.
FIG. 19 is an elevational view showing a process of the invention with the steps taking place from right to left of the view.

In FIG. 19 of the drawings I present a part diagram, part flow chart showing how the motion dye transfer and selective transfer features of the invention can be used to produce an end product comprising a sheet having an aluminum or other type of reflector behind the dye **66*a* containing the motion pattern so that the product can be used in reflected light systems. Looking at the right hand of the figure, a carrier strip 100 having a dye side 66*a* is prepared in accordance with the procedures set forth hereinabove. The strip is moved from right to left in the direction of the arrow, and is joined to a mylar sheet or web 240 having a layer of vacuumized metal aluminum 242 bonded to it by means of a heat seal resin 244. The aluminum layer 242 is bonded to the dye side 66*a* by means of heat such as at pressure roller 246 having heating means 27. As the laminated strip is flowed to the left, the mylar portion 240 is stripped off, and is replaced with a web of paper or other material 248 having a print or other visual stimuli on it which is to be registered with the motion pattern contained in the dye 66*a*. The web of paper or other material 248 has a series of heat seal resin areas selectively placed on it to correspond with the motion pattern areas in the dye 66*a*. A continuous hot nip roller 252 similar to roller 200 with raised portions 254 similar to raised portions 202 is pressed against web 250 in the presence of heat by means of heater 27. The raised portions 254 are made to correspond with the portions of heat seal resin 250 which in turn correspond with the motion pattern on the dye 66*a*. As the web moves further to the left in the direction of the arrows, the carrier strip 100 is stripped off while the heat seal resin portions 250 are selectively bonded to the metallized aluminum layer 242 and the dye 66*a*. Those portions of the metallized aluminum layer 242 and the dye 66*a* which are not under the selective pressing of dye 252 remain with carrier 100 and are stripped off, and the other portions of the dye which are subject to the pressure of the raised portions 254 remain with web 248. A coating of lacquer 256 is then placed on web 248 by means of a spray nozzle 258 or any other suitable means. At the extreme left of FIG. 19 is shown a portion of the web after having been cut off which is the resultant product having a paper or other material backing 248, an aluminum reflective layer 242, a dye layer 66*a*, and a lacquer coating 256. When polarized light is directed through the dye layer to the reflective surface 242 and then reflected back again and viewed through the proper spinners, the phenomenon of motion will be apparent. Motion can also be apparent when rotating polarized light is shined on the reflective surface. This motion will be coordinated with any picture or visual stimuli on the backing surface 248**.

While I have described my invention in its preferred forms, there are other forms which it may take without departing from the spirit and scope of the invention. For example, the continuous hot nip or hot dye stamp methods described hereinabove can be accomplished by heat, mechanical or electrical means such as ultrasonic means, dielectric means, impulse heat seal and other such means. In addition, the transfer of the motion dye from the matrix or other transferring material to a carrier or other transferee material does not require the use of thermoplastic materials plus heat and pressure, but can be accomplished by such other adhesive means as the use of gelatins including photo sensitive gelatins and photographic film emulsions having adhesive properties, polyvinyl acetates having adhesive properties, rubberlike pressure sensitive adhesives, solvent reactivated adhesives or any other mechanical or chemical adhesive material suitable to the invention, and I, therefore, desire to be protected for all forms of the methods, apparatus and products of the invention as fall within the scope of the claims hereinbelow.

Wherefore I claim:

1. A method for orienting the surface molecules of a matrix into a motion pattern in the latent state comprising the steps of coating the surface of the matrix with photo resist material, preparing a mask for each vector of orientation desired, each of said masks having at least one portion adapted to permit exposure of all but the selected portions, then placing a first mask over the coating of photo resist exposing the photo resist to light, then washing away the unexposed portions and orienting all unexposed portions in a single vector, then stripping the photo resist from the matrix, then recoating the matrix with photo resist and placing another mask comprising other selected areas, then exposing the photo resist to light and washing away the unexposed portions and orienting the uncovered portions of the matrix in a vector different from the previous vector, and then repeating the foregoing steps for as many vectors as may be desired.

* * * * *